US006876253B2

(12) United States Patent
Tellier et al.

(10) Patent No.: US 6,876,253 B2
(45) Date of Patent: Apr. 5, 2005

(54) AMPLIFIER FOR ALTERNATING SIGNALS SUPERIMPOSED ON A CONTINUOUS SIGNAL AND METHOD FOR AMPLIFYING SUCH SIGNALS

(75) Inventors: Thierry Tellier, Grasse (FR); Lionel Guiraud, Saint Aubin sur Mer (FR); Joao Nuno Ramalho, Algueirao Mem-Martins (PT)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/254,227

(22) Filed: Sep. 25, 2002

(65) Prior Publication Data
US 2004/0150477 A1 Aug. 5, 2004

(30) Foreign Application Priority Data
Sep. 28, 2001 (FR) ............................................. 01 12510

(51) Int. Cl.[7] .............................. H03F 1/02; H03F 1/14; H03G 3/12
(52) U.S. Cl. ............................ 330/9; 330/282; 330/292
(58) Field of Search ............................. 330/9, 282, 292

(56) References Cited

U.S. PATENT DOCUMENTS

| | | | | |
|---|---|---|---|---|
| 5,079,514 A | * | 1/1992 | Mijuskovic | ................. 330/253 |
| 5,369,345 A | * | 11/1994 | Phan et al. | ................. 318/561 |
| 5,559,646 A | | 9/1996 | Voorman et al. | ............... 360/67 |
| 5,729,230 A | * | 3/1998 | Jensen et al. | ................ 341/143 |
| 6,005,742 A | * | 12/1999 | Cunningham et al. | ... 360/78.05 |
| 6,281,758 B1 | * | 8/2001 | Elsayed et al. | ............... 331/16 |

FOREIGN PATENT DOCUMENTS

| | | | | |
|---|---|---|---|---|
| WO | WO0124168 | | 9/2000 | ............ G11B/5/09 |

* cited by examiner

*Primary Examiner*—Patricia Nguyen
(74) *Attorney, Agent, or Firm*—Peter Zawilski

(57) ABSTRACT

This amplifier is intended for amplifying variable signals superimposed on a continuous signal. This continuous signal serves in particular for biasing a component, a magnetoresistive resistor used as a hard disk reading head. To avoid the harmful effects of a sudden fluctuation in the continuous signal, this amplifier comprises a set of switchable reactive elements (70) for acting on said transfer function and a bias drift compensation circuit (80) for controlling the switching of said switchable elements with a view to anticipating the effects of said fluctuation.

7 Claims, 4 Drawing Sheets

AMPLIFIER FOR ALTERNATING SIGNALS SUPERIMPOSED ON A CONTINUOUS SIGNAL AND METHOD FOR AMPLIFYING SUCH SIGNALS

The invention concerns an amplifier for variable signals superimposed on a continuous signal intended in particular for biasing a component, comprising a feedback loop whose properties are defined from an open loop transfer function.

The invention also concerns a method for amplifying such signals.

The invention finds important applications in particular with regard to the amplification of signals supplied by magnetoresistive heads used in computer hard disks.

Such an amplifier is known from patent document U.S. Pat. No. 5,559,646. Although giving satisfaction, it has turned out that it was necessary to make improvements to it with regard to its speed of response to the variations in the continuous component due, for example, to head switching or collisions of the head with particles which may be deposited on the tracks. Such collisions create an abrupt rise in temperature giving rise to a variation in the continuous component. These variations cause an increase in the voltage offset of the amplifier. This offset requires a length of time deemed considerable before returning to a suitable value since data may be lost. To reduce this time, it is known how to increase the gain of the loop. However, this measure is considered insufficient.

The present invention proposes an amplifier of the type mentioned in the preamble which to a great extent improves the time necessary for the offset voltage to resume a suitable value.

For this purpose, such an apparatus is characterized in that it comprises a set of switchable elements for acting on said transfer function and a biasing drift compensation circuit for controlling the switching of said switchable elements with a view to anticipating the effects of said drift.

A method for amplifying variable signals superimposed on a continuous signal using an amplifier provided with at least one loop whose response is defined by the open loop transfer function comprising at least one zero and one pole is characterized in that the transfer function is modified when a drift in the continuous signal occurs. In addition, this is a second-order transfer function. Changing this transfer function consists of moving its zero and its pole.

The invention will be further described with reference to examples of embodiment shown in the drawings to which, however, the invention is not restricted. In the drawings.

Figure 1:
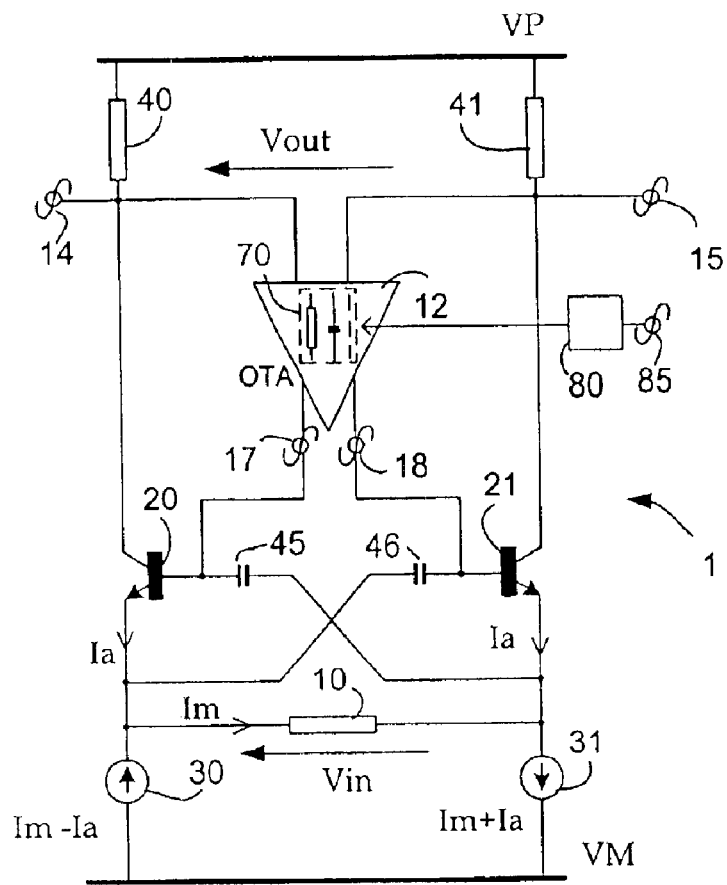
FIG. 1 shows an amplifier in accordance with the invention.

In FIG. 1, the amplifier bears the reference 1. This amplifier, in the context of the example described, is an amplifier for a magnetoresistive resistor 10 intended for reading a hard disk (not shown) of the type normally found in personal computers of the PC type. This amplifier comprises an amplifier assembly 12 of the OTA type, that is to say an amplifier which receives a voltage at its inputs 14 and 15 and which supplies at its outputs 17 and 18 currents in phase opposition. This amplifier assembly 12 has a certain transfer function on which the invention will act.

This amplifier 1 comprises two transistors 20 and 21 to the bases of which are applied the currents in phase opposition coming from the outputs 17 and 18. The emitters of these transistors 20 and 21 are connected to the ends of the magnetoresistive resistor 10 while their collectors are connected to the inputs 14 and 15. In addition, the emitters of the transistors 20 and 21 are connected to a reference potential VM via current generators 30 and 31, respectively. Their collectors are connected to a voltage source VP via load resistors 40 and 41, respectively. In addition, the base of the transistor 20 is connected to the emitter of the transistor 21 by means of a capacitor 45, while the base of the transistor 21 is connected to the emitter of the transistor 20 by means of a capacitor 46.

In a balanced state, the emitters of the transistors supply a current Ia, slaved to this value by a loop, not shown (see text of patent cited). If Im is the bias current of the magnetoresistive resistor 10, then the generators 30 and 31 supply currents Im−Ia and Im+Ia, respectively.

If a variation appears, the collector current varies so that there is for example an increase +Δi in the resistor 40 and an increase of the opposite sign in the resistor 41. The variation in the voltage Vout at the terminals 14 and 15 can then be written $$\Delta vout = 2.RL.\Delta I \tag{1}$$

This variation is due to a variation in the voltage Vin which is created at the ends of the magnetoresistive resistor 10: let this variation be ΔVIN. It creates the ΔI. It is then possible to write:

$$\Delta I = \Delta VIN/(Rmr + 1/gm) \tag{2}$$

where gm is the transconductance of the transistors 20 and 21 and Rmr the value of the resistance of the magnetoresistive element 10. This voltage variation will create current variations at the outputs 17 and 18 of the amplifier 12 Δis and −Δis. Hence the gain Ao:

$$Ao = \frac{\Delta Vo}{\Delta Vin} = \frac{2 \cdot RL}{Rmr + \dfrac{1}{gm}}$$

UGF is also defined, which is the unitary frequency, that is to say it is the frequency for which there is unity gain; this value is fixed by the specifications of the system.

$$UGF = \frac{A_0 \cdot Gm^{1st}}{2\pi C_e}$$

where $Gm^{1st}$ is the transconductance of the amplifier 12 having a first-order loop.

The frequency fce is also determined, which is the change of direction point on the gain curve.

$$fc_e = \frac{1}{2\pi C_e Z_e}$$

$Z_e$ being the input impedance of the NPN transistors 20 and 21 used.

Figure 2:
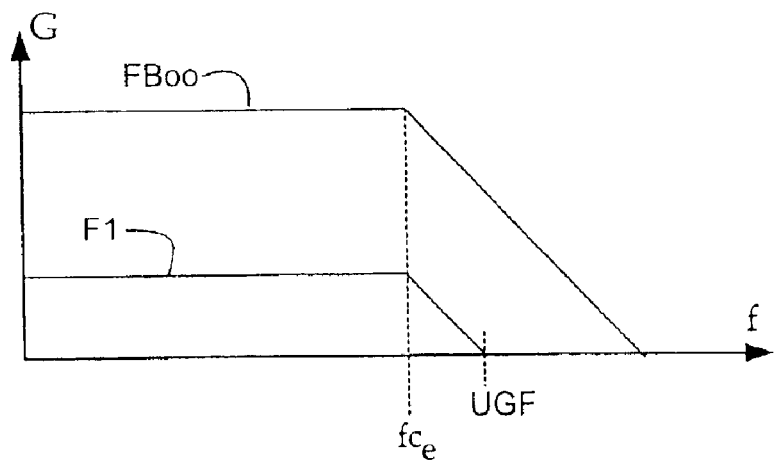
FIG. 2 shows a first-order transfer function.

FIG. 2 shows the transfer function F1 of this first-order loop.

To compensate quickly for a fluctuation in the bias current of the magnetomotive resistor, following a change in read write of the disk, it would be possible to increase the gain in the loop Ao for a certain length of time (booster time). This is shown by the function Fboo in FIG. 2. However, this creates an offset in the input voltage of the amplifier assembly 12 proportional to the open loop gain. At the end of the gain increase period, there is once again an offset which it is again necessary to compensate for. This last compensation time may be very long given that the gain in the loop has become lower.

To avoid these faults, the invention proposes to use a second-order loop for at least the booster period without increasing the gain.

For this purpose, the amplifier is provided with a set of switchable elements 70 which makes it possible to define zeros and poles of this transfer function. These elements are switched according to output signals of a sequencing circuit 80 which is triggered by control signals applied to its input 85 (FIG. 1).

According to the invention, during a period contained in the booster period, the loop is a second-order loop, with a gain equal to that of the loop in the normal state.

Figure 3:
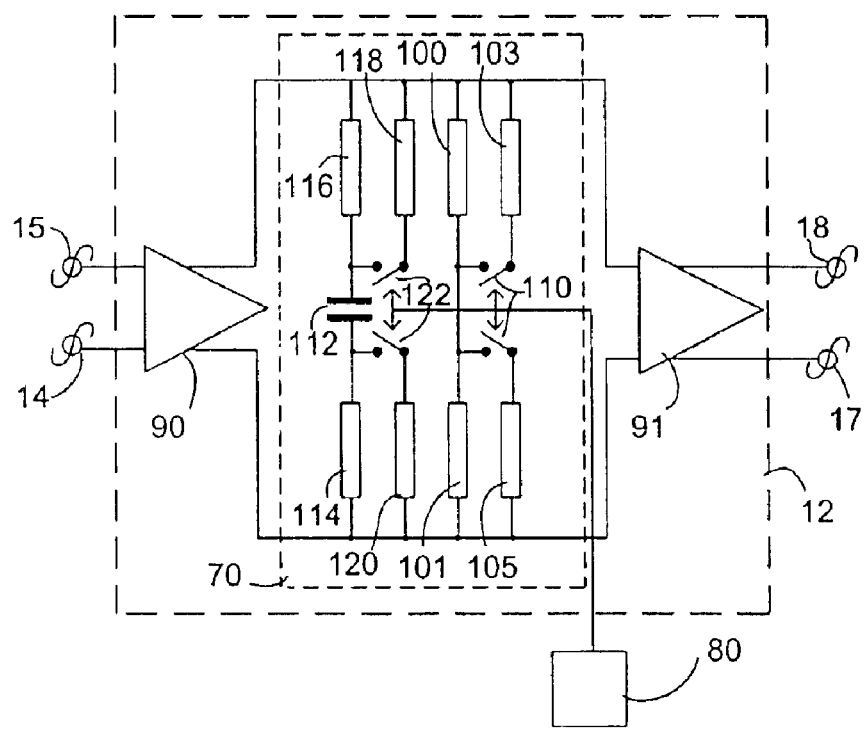
FIG. 3 shows a first embodiment of the invention.

FIG. 3 shows an example embodiment of the invention. The OTA amplifier assembly 12 is in the form of two amplifiers 90 and 91 connected in cascade. These two amplifiers are of the OTA type. Between the outputs of the amplifier 90 and the input of the amplifier 91 all the switchable elements 70 are disposed. In the embodiment described, these elements are a first group of resistors comprising the resistors 100 and 101 disposed symmetrically at the outputs of the amplifier 90. Two other resistors 103 and 105 can be put in parallel to these resistors, respectively, by means of a switch 110 controlled by the sequencing circuit 80. A series circuit of a capacitor 112 with two resistors 114 and 116 is also connected at the output of the amplifier 90. Two other resistors 118 and 120 can also be put in parallel to the resistors 116 and 114 respectively by means of a switch 122.

Figure 4:
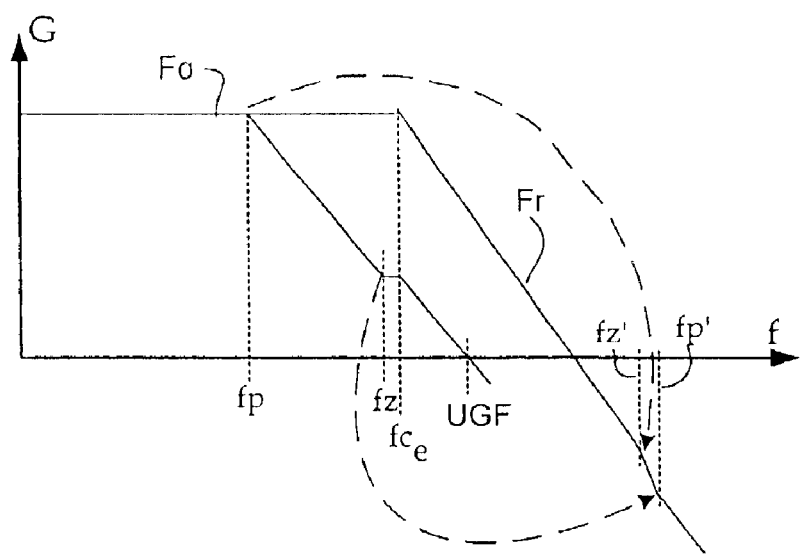
FIG. 4 shows the transfer functions used by the first embodiment.

FIG. 4 shows the influence of the switches on the gain function of the amplifier. It can be seen from the curve that there is a movement of the zero and pole, which is represented by the arrows. The gain function in normal operation is shown by the reference Fq. This is a second-order function, the frequency of the pole is referred to as fp and that of the zero as fz. During the booster time, these frequencies become respectively fp' and fz', which is shown by the function Fr.

Figure 5:
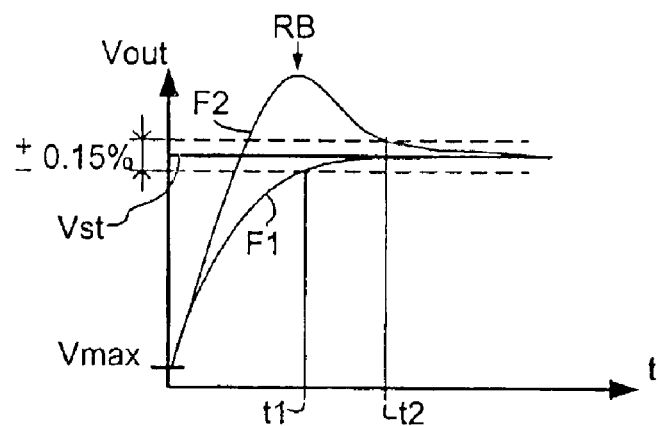
FIG. 5 shows the response of the amplifiers having first and second-order transfer functions.

As these functions are second-order functions, they exhibit a bounce RB from the saturation value Vmax of the amplifier 12 before reaching the normal operating value Vst. This function F2 is shown in FIG. 5. The value Vst is reached at time t2 with a precision of 0.15%. This is to be compared with the response of a first-order function, F1. The value Vst is always reached with the same precision at time t1 less than time t2.

Figure 6:
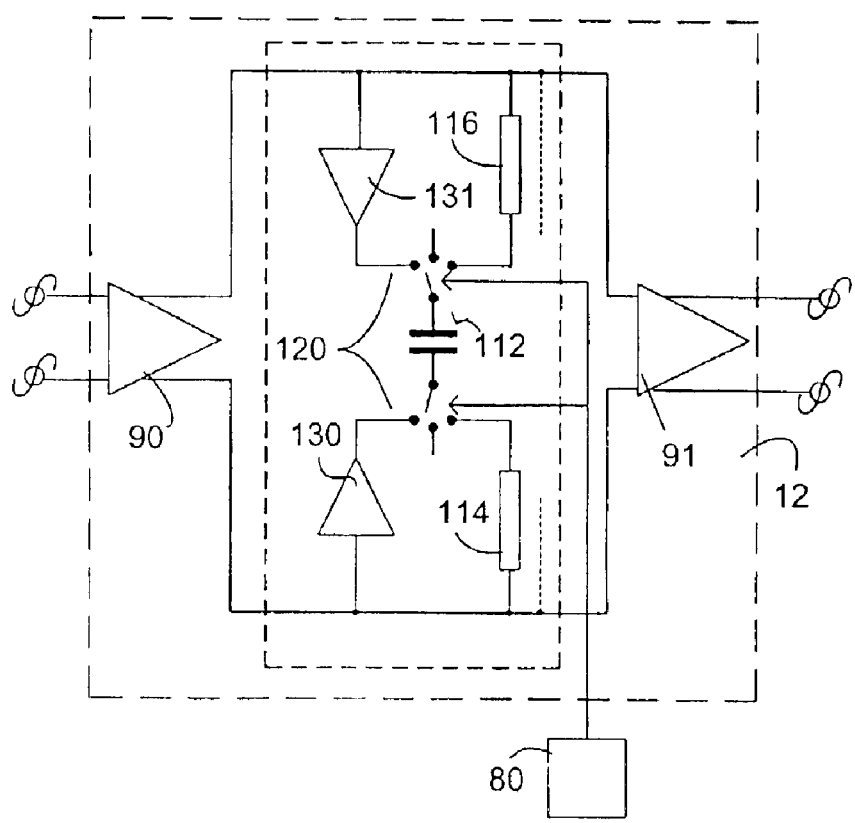
FIG. 6 shows a second embodiment of the invention.

To prevent this bounce, the invention proposes a preferred embodiment which is shown in FIG. 6.

This preferred embodiment consists of providing a switch 120 at the plates of the capacitor 112. Through this switch set in a first position the plates are connected to the resistors 114 and 116, in a second position these plates are "floating", that is to say not connected, and in a third position connected to the output of the voltage amplifiers 130 and 131 so that the voltage prevailing at the outputs of the amplifier 90 is instantaneously transferred to the plates of this capacitor.

This mode functions as follows as soon as there is an abrupt drift to be overcome:

Phase I: Disconnection of the capacitor 112; the loop is then a first-order loop and therefore converges more quickly towards its normal operating value.

Phase II: Connection of the plates of the capacitor 112 to the outputs of the amplifiers 130 and 131 so that this capacitor is instantaneously charged with the offset values.

Phase III: Connection of the capacitor plates to the resistors 114 and 116.

During the phases I and II, the passband is increased by switching the resistors 113 and 115 to the resistors 100 and 101.

Figure 7:
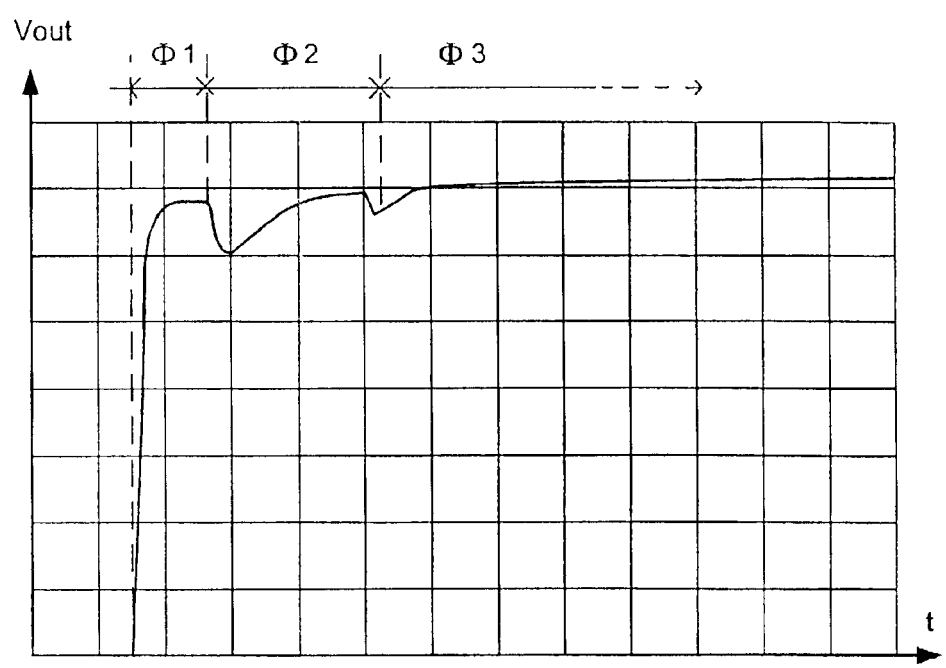
FIG. 7 shows the response of the second embodiment.

These various phases are shown in FIG. 7.

Although the invention has been described in the context of the application aimed at hard-disk technology, it goes without saying that it covers all cases where it is a question of compensating for a drift in a continuous signal on which variable signals are superimposed.

What is claimed is:

1. An amplifier for variable signals superimposed on a continuous signal intended in particular for biasing a component, comprising a feedback loop whose properties are defined from an open loop transfer function, characterized in that it comprises a set of switchable elements for acting on said transfer function and a biasing drift compensation circuit for controlling the switching of said switchable elements with a view to anticipating the effects of said drift.

2. An apparatus as claimed in claim 1, characterized in that the switching of the switchable elements converts the loop into a second-order loop having a first pole and a first zero.

3. An apparatus as claimed in claim 2, characterized in that the switching of the switchable elements converts the loop into a second-order loop for a period contained within a so-called booster period by moving the first pole and the first zero to higher frequency values.

4. An apparatus as claimed in claim 3, characterized in that the booster period includes a first phase during which the loop is converted into a first-order loop before being converted into a second-order loop.

5. An apparatus as claimed in claim 4, characterized in that it comprises a capacitor for establishing the second-order loop, and at least one follower amplifier for charging the capacitor at the end of the phase during which the loop is a first-order loop.

6. A method for amplifying variable signals superimposed on a continuous signal using an amplifier provided with at least one loop whose response is defined by the open loop transfer function having at least one zero and one pole, characterized in that the transfer function is modified when a drift in the continuous signal occurs.

7. A method as claimed in claim 6, characterized in that the transfer function is a second-order transfer function and in that the modification of this transfer function consists of moving its zero and its pole.

* * * * *